(12) United States Patent
Byom et al.

(10) Patent No.: US 8,495,402 B2
(45) Date of Patent: Jul. 23, 2013

(54) METHODS AND SYSTEMS FOR DYNAMICALLY CONTROLLING OPERATIONS IN A NON-VOLATILE MEMORY TO LIMIT POWER CONSUMPTION

(75) Inventors: Matthew Byom, Campbell, CA (US); Vadim Khmelnitsky, Foster City, CA (US); Hugo Fiennes, Palo Alto, CA (US); Arjun Kapoor, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 285 days.

(21) Appl. No.: 12/969,839

(22) Filed: Dec. 16, 2010

(65) Prior Publication Data

US 2012/0023348 A1    Jan. 26, 2012

Related U.S. Application Data

(63) Continuation of application No. 12/843,448, filed on Jul. 26, 2010.

(51) Int. Cl.
 *G06F 1/30* (2006.01)
 *G06F 1/32* (2006.01)

(52) U.S. Cl.
 USPC ............................ 713/320; 713/300; 713/502

(58) Field of Classification Search
 None
 See application file for complete search history.

(56) References Cited

U.S. PATENT DOCUMENTS

| | | | |
|---|---|---|---|
| 5,422,856 A * | 6/1995 | Sasaki et al. ............. | 365/230.03 |
| 5,724,592 A | 3/1998 | Garner | |
| 6,636,976 B1 * | 10/2003 | Grochowski et al. ......... | 713/320 |
| 6,748,441 B1 | 6/2004 | Gemmell | |
| 6,748,493 B1 | 6/2004 | Arroyo et al. | |
| 7,305,572 B1 | 12/2007 | Burroughs et al. | |
| 7,440,215 B1 | 10/2008 | Sardella et al. | |
| 7,654,466 B2 | 2/2010 | Maeda | |
| 7,702,831 B2 | 4/2010 | Ma et al. | |
| 7,719,917 B2 | 5/2010 | Roohparvar | |
| 2002/0181311 A1 | 12/2002 | Miyauchi et al. | |
| 2003/0126475 A1 | 7/2003 | Bodas | |
| 2005/0125703 A1 | 6/2005 | Lefurgy et al. | |
| 2006/0082222 A1 | 4/2006 | Pincu et al. | |
| 2006/0184758 A1 | 8/2006 | Satori et al. | |

(Continued)

FOREIGN PATENT DOCUMENTS

| | | |
|---|---|---|
| EP | 0878755 | 11/1998 |
| EP | 0955573 | 11/1999 |

(Continued)

*Primary Examiner* — Dennis M Butler

(74) *Attorney, Agent, or Firm* — Van Court & Aldridge LLP

(57) ABSTRACT

Systems and methods are disclosed for limiting power consumption of a non-volatile memory (NVM) using a power limiting scheme that distributes a number of concurrent NVM operations over time. This provides a "current consumption cap" that fixes an upper limit of current consumption for the NVM, thereby eliminating peak power events. In one embodiment, power consumption of a NVM can be limited by receiving data suitable for use as a factor in adjusting a current threshold from at least one of a plurality of system sources. The current threshold can be less than a peak current capable of being consumed by the NVM and can be adjusted based on the received data. A power limiting scheme can be used that limits the number of concurrent NVM operations performed so that a cumulative current consumption of the NVM does not exceed the adjusted current threshold.

13 Claims, 15 Drawing Sheets

U.S. PATENT DOCUMENTS

| | | |
|---|---|---|
| 2006/0288241 A1 | 12/2006 | Felter et al. |
| 2007/0168625 A1 | 7/2007 | Cornwell et al. |
| 2007/0211551 A1 | 9/2007 | Yogev et al. |
| 2008/0164903 A1 | 7/2008 | Barrows et al. |
| 2010/0036998 A1 | 2/2010 | Ben-Rubi |
| 2010/0049905 A1 | 2/2010 | Ouchi |
| 2010/0162006 A1 | 6/2010 | Therien et al. |
| 2010/0274933 A1 | 10/2010 | Wang |
| 2010/0293439 A1 | 11/2010 | Flynn et al. |
| 2010/0293440 A1 | 11/2010 | Thatcher et al. |
| 2010/0306451 A1 | 12/2010 | Johnson |
| 2011/0173462 A1 | 7/2011 | Wakrat et al. |
| 2012/0023351 A1 | 1/2012 | Wakrat et al. |
| 2012/0023356 A1 | 1/2012 | Byom et al. |
| 2012/0254595 A1 | 10/2012 | Wu et al. |

FOREIGN PATENT DOCUMENTS

| | | |
|---|---|---|
| EP | 1688866 | 8/2006 |
| EP | 1818830 | 8/2007 |
| WO | 03/029951 | 4/2003 |
| WO | 2006/059698 | 6/2006 |
| WO | 2007/024396 | 3/2007 |
| WO | 2008/017624 | 2/2008 |

* cited by examiner

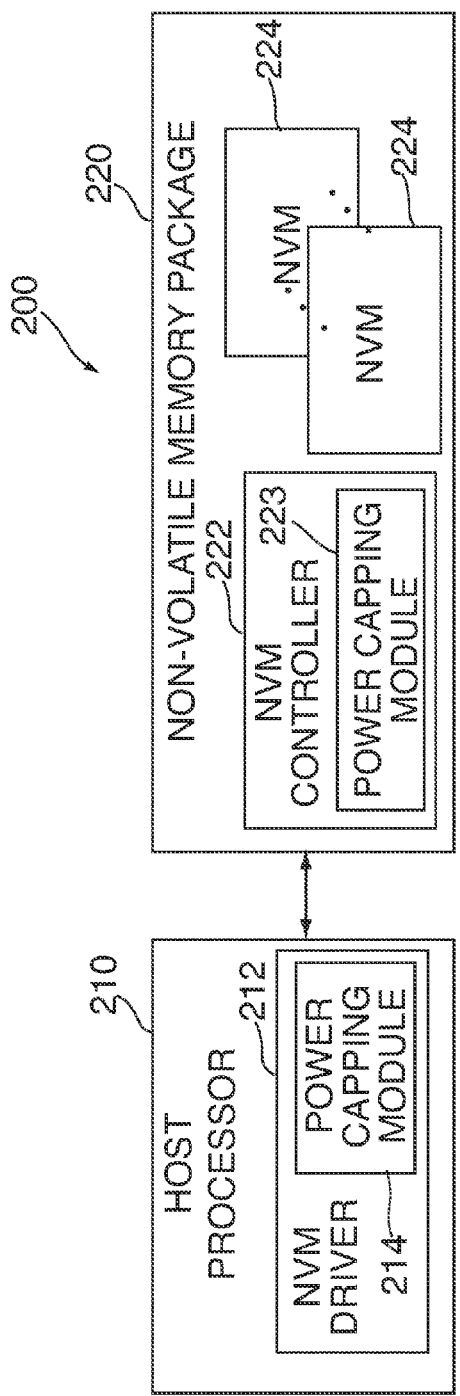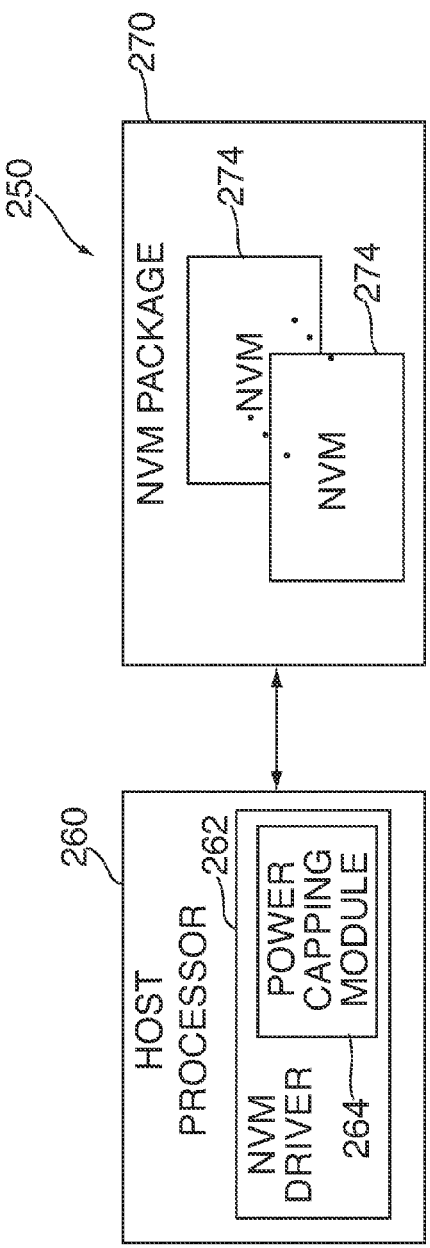

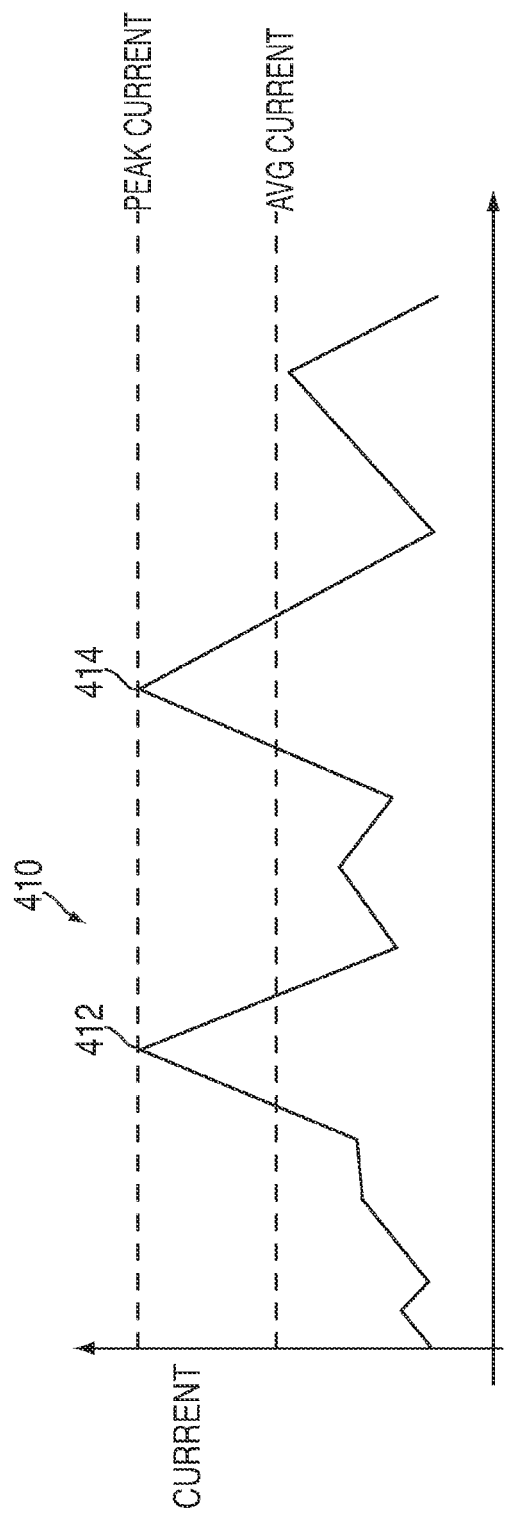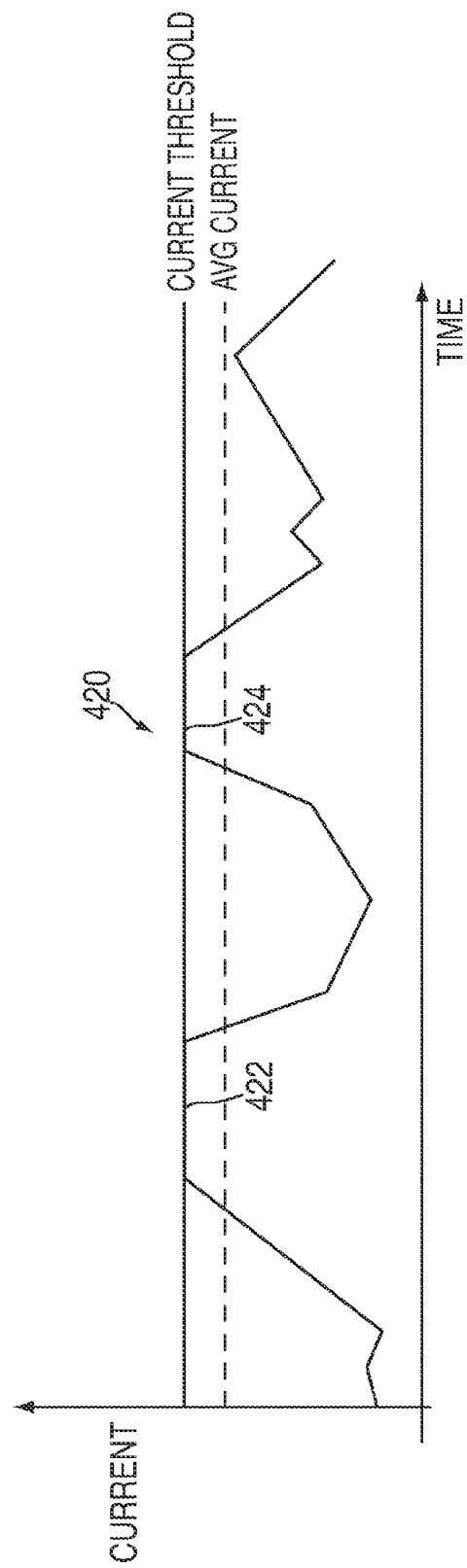

METHODS AND SYSTEMS FOR DYNAMICALLY CONTROLLING OPERATIONS IN A NON-VOLATILE MEMORY TO LIMIT POWER CONSUMPTION

CROSS-REFERENCE TO RELATED APPLICATION

This is a continuation of U.S. patent application Ser. No. 12/843,448, filed Jul. 26, 2010, which is fully incorporated herein by reference.

FIELD OF THE INVENTION

This can relate to dynamically controlling operations in a non-volatile memory, such as a NAND flash memory, to limit power consumption.

BACKGROUND OF THE DISCLOSURE

Electronic systems are becoming more and more complex and are incorporating more and more components. As such, power demands for these systems continue to be a concern. In particular, because many of the components in a system may operate at the same time, the system can suffer from power or current spikes. This effect may be particularly pronounced when various system components are each performing high-power operations concurrently.

A flash memory system, which is commonly used for mass storage in consumer electronics, is one example of a system in which power consumption is a concern. In heavy usage, the flash system can experience elevated levels of power events, referred to herein as peak power events. A peak power event may occur when each die in the flash memory system is being accessed simultaneously. Systems that use flash memory systems are designed to handle such peak power events (i.e., maintain sufficient power resources to satisfy the power demand of peak power events). However, peak power events can be relatively infrequent, and the average power consumption of the flash system can be substantially less than peak power. Thus, as a result, these systems are designed to have elevated levels of power on reserve even though the elevated power level is not always needed.

SUMMARY OF THE DISCLOSURE

Systems and methods are disclosed for limiting power consumption of a non-volatile memory (NVM) using a power limiting scheme that distributes a number of concurrent NVM operations over time. This provides a "current consumption cap" that fixes an upper limit of current consumption for the NVM, thereby eliminating peak power events.

In one embodiment, power consumption of a NVM can be limited by receiving data suitable for use as a factor in adjusting a current threshold from at least one of a plurality of system sources. The current threshold can be less than a peak current capable of being consumed by the NVM and can be adjusted based on the received data. A power limiting scheme can be used that limits the number of concurrent NVM operations performed so that a cumulative current consumption of the NVM does not exceed the adjusted current threshold. In one embodiment, the power limiting scheme can be a reactive power limiting scheme that uses feedback data provided by the NVM to determine when each NVM operation is complete. In another embodiment, the power limiting scheme can be a predictive power limiting scheme that predicts how long each NVM operation will take to complete.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which:

FIG. 2A is a schematic view of an illustrative system including a host processor and a managed non-volatile memory package configured in accordance with various embodiments of the invention;

FIG. 2B is a schematic view of an illustrative system including a host processor and a raw non-volatile memory package configured in accordance with various embodiments of the invention;

FIG. 4A shows illustrative cumulative current consumption profile of all die in a NVM package being controlled by a prior art system;

FIG. 4B shows illustrative cumulative current consumption profile of all die in a NVM package being controlled by a system according to various embodiments of the invention;

DETAILED DESCRIPTION OF THE DISCLOSURE

Figure 1:
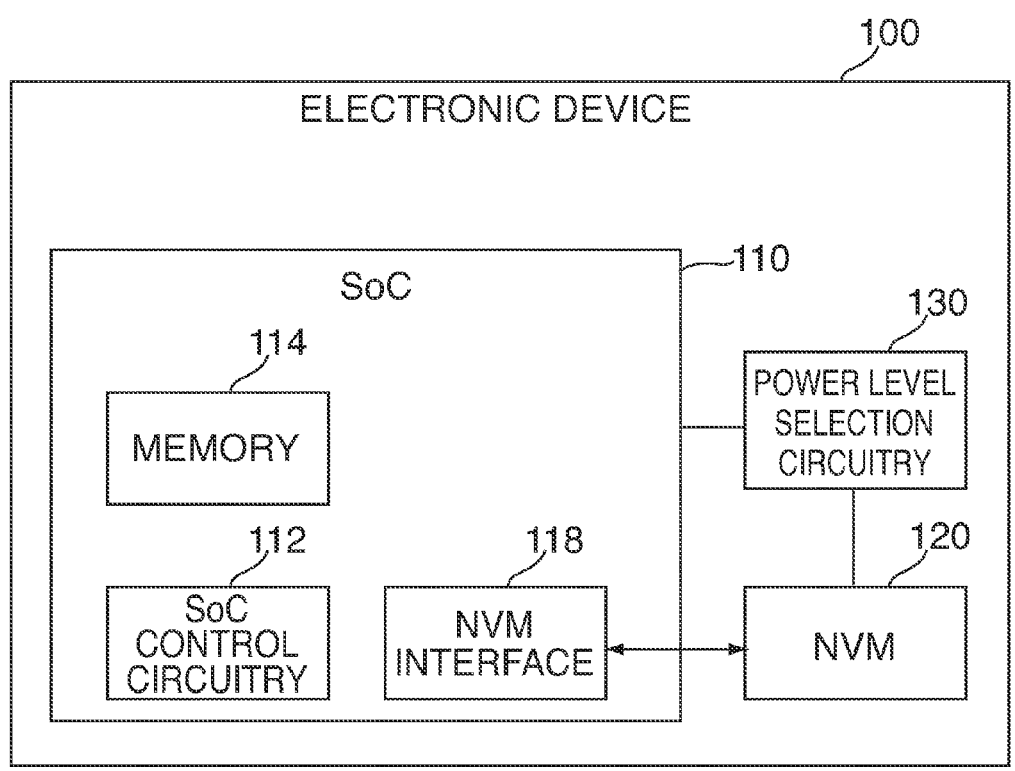
FIG. 1 is a schematic view of an electronic device configured in accordance with various embodiments of the invention.

FIG. 1 is a schematic view of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110, non-volatile memory ("NVM") 120, and power level selection circuitry 130. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), any other known or future types of non-volatile memory technology, or any combination thereof. NVM memory 120 can include one or more dies that can be organized into "blocks," which are the smallest units of erase, and further organized into "pages," which are the smallest programmable and readable units. In some embodiments, NVM 120 can include multiple integrated circuits, where each integrated circuit may have multiple blocks. The blocks from corresponding integrated circuits (e.g., blocks having the same position or block number) may form "super blocks." Each memory location (e.g., page or block) of NVM 120 can be addressed using a physical address (e.g., a physical page address or physical block address).

Power level selection circuitry 130 can set a power level that limits a maximum quantity of power or current that can be consumed by NVM 120. The power level can include a voltage level, a current level, or both. Circuitry 130 can be operative to select a power level based on any number of factors. These factors can include, for example, power available from a power source (e.g., available battery power), power loads required by various components in device 100 (e.g., SoC control circuitry 112), and temperature of device 100. Although circuitry 130 is shown to be illustratively connected to SoC 110 and NVM 120, it is understood that circuitry 130 can be connected to any component of device 100. Additional details of circuitry 130 are provided below in connection the description accompanying FIG. 5.

FIG. 1, as well as later figures and various disclosed embodiments, may sometimes be described in terms of using flash technology. However, this is not intended to be limiting, and any other type of non-volatile memory can be implemented instead. Electronic device 100 can include other components, such as a power supply or any user input or output components, which are not depicted in FIG. 1 to prevent overcomplicating the figure.

System-on-a-chip 110 can include SoC control circuitry 112, memory 114, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile or non-volatile memory, such as dynamic random access memory ("DRAM"), synchronous dynamic random access memory ("SDRAM"), double-data-rate ("DDR") RAM, cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write commands from SoC control circuitry 112, perform wear leveling, and generate read and program instructions compatible with the bus protocol of NVM 120.

While NVM interface 118 and SoC control circuitry 112 are shown as separate modules, this is intended only to simplify the description of the embodiments of the invention. It should be understood that these modules may share hardware components, software components, or both. For example, a processor implemented as part of SoC control circuitry 112 may execute a software-based memory driver for NVM interface 118. Accordingly, portions of SoC control circuitry 112 and NVM interface 118 may sometimes be referred to collectively as "control circuitry."

FIG. 1 illustrates an electronic device where NVM 120 may not have its own controller. In other embodiments, electronic device 100 can include a target device, such as a flash or SD card, that includes NVM 120 and some or all portions of NVM interface 118 (e.g., a translation layer, discussed below). In these embodiments, SoC 110 or SoC control circuitry 112 may act as the host controller for the target device. For example, as the host controller, SoC 110 can issue read and write requests to the target device.

FIGS. 2A and 2B are schematic views of systems, which are examples of various embodiments of embodiment 100 of FIG. 1. Looking first to FIG. 2A, system 200 can include host processor 210 and at least one non-volatile memory ("NVM") package 220. Host processor 210 and optionally NVM package 220 can be implemented in any suitable host device or system, such as a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, or a laptop computer.

Host processor 210 can include one or more processors or microprocessors that are currently available or will be developed in the future. Alternatively or in addition, host processor 210 can include or operate in conjunction with any other components or circuitry capable of controlling various operations of memory system 200 (e.g., application-specific integrated circuits ("ASICs")). In a processor-based implementation, host processor 210 can execute firmware and software programs loaded into a memory (not shown) implemented on the host. The memory can include any suitable type of volatile memory (e.g., cache memory or random access memory ("RAM"), such as double data rate ("DDR") RAM or static RAM ("SRAM")). Host processor 210 can execute NVM driver 212, which may provide vendor-specific and/or technology-specific instructions that enable host processor 210 to perform various memory management and access functions for non-volatile memory package 220. Host processor 210 can perform any of the functions of SoC 110 (of FIG. 1).

Host processor 210 can also execute power capping module 214, which may be implemented as part of NVM driver 212. Power capping module 214 may operate as the power consumption controller of NVM package 220, and can implement various power limiting schemes in accordance with various embodiments of the invention. These power limiting schemes can cap the power consumed by NVM package 220 by controlling the number of die 224 that can be simultaneously accessed. The various power limiting schemes according to embodiments of the invention are discussed in more detail below.

NVM package 220 may be a ball grid array ("BGA") package or other suitable type of integrated circuit ("IC")

package. NVM package 220 may be managed NVM package. In particular, NVM package 220 can include NVM controller 222 coupled to any suitable number of NVM dies 224. NVM controller 222 may include any suitable combination of processors, microprocessors, or hardware-based components (e.g., ASICs), and may include the same components as or different components from host processor 210. NVM controller 222 may share the responsibility of managing and/or accessing the physical memory locations of NVM dies 224 with NVM driver 212. Alternatively, NVM controller 222 may perform substantially all of the management and access functions for NVM dies 224. Thus, a "managed NVM" may refer to a memory device or package that includes a controller (e.g., NVM controller 222) configured to perform at least one memory management function for a non-volatile memory (e.g., NVM dies 224). Memory management and access functions that may be performed by NVM controller 222 and/or host processor 210 for NVM dies 224 can include issuing read, write, or erase instructions and performing wear leveling, bad block management, garbage collection, logical-to-physical address mapping, SLC or MLC programming decisions, applying error correction or detection, and data queuing to set up program operations.

NVM package 220 can include power capping module 223, which can be executed by NVM controller 222. Power capping module 223 can have the same operating capabilities as power capping module 214. In some embodiments, both power capping modules 214 and 223 can be included in system 200. In this embodiment, modules 214 and 223 may work together to implement a power limiting scheme according to an embodiment of the invention. For example, module 214 may function as a master and module 223 may function as a slave. In another embodiment, system 200 can include power capping module 214, but not power capping module 223. In yet another embodiment, system 200 can include power capping module 223, but not power capping module 214.

NVM dies 224 may be used to store information that needs to be retained when memory system 200 is powered down. As used herein, and depending on context, a "non-volatile memory" can refer to NVM dies in which data can be stored, or may refer to a NVM package that includes the NVM dies.

Referring now to FIG. 2B, a schematic view of system 250 is shown, which may be an example of another embodiment of electronic device 100 of FIG. 1. System 250 may have any of the features and functionalities described above in connection with system 200 of FIG. 2A. In particular, any of the components depicted in FIG. 2B may have any of the features and functionalities of like-named components in FIG. 2A, and vice versa.

System 250 can include host processor 260 and non-volatile memory package 270. Unlike memory system 200 of FIG. 2A, NVM package 270 does not include an embedded NVM controller, and therefore NVM dies 274 may be managed entirely by host processor 260 (e.g., via NVM driver 262). Thus, non-volatile memory package 270 may be referred to as a "raw NVM." A "raw NVM" may refer to a memory device or package that may be managed entirely by a host controller or processor (e.g., host processor 260) implemented external to the NVM package. Host processor 260 may perform any of the other memory management and access functions discussed above in connection with host processor 210 and NVM controller 222 of FIG. 2A. In addition, host processor 260 may perform any of the functions of SoC 110 (of FIG. 1).

Host processor 260 can also execute power capping module 264, which may be implemented as part of NVM driver 262. Power capping module 264 can have the same operating capabilities as power capping module 214 (FIG. 2A).

With continued reference to both FIGS. 2A and 2B, NVM controller 222 (FIG. 2A) and host processor 260 (e.g., via NVM driver 262) (FIG. 2B) may each embody the features and functionality of SoC 110 discussed above in connection with FIG. 1, and NVM dies 224 and 274 may embody respective power consumption profiles that may be ascertained using various embodiments of the invention. In particular, NVM dies 224 (FIG. 2A) and 274 (FIG. 2B) may each have a peaky current profile, where the highest peaks occur when a die is performing its most power-intensive operations. In flash memory embodiments, an example of such a power-intensive operation is a sensing operation (e.g., current sensing operation), which may be used when reading data stored in memory cells. Such sensing operations may be performed, for example, responsive to read requests from a host processor and/or a NVM controller when verifying that data was properly stored after programming.

Figure 2C:
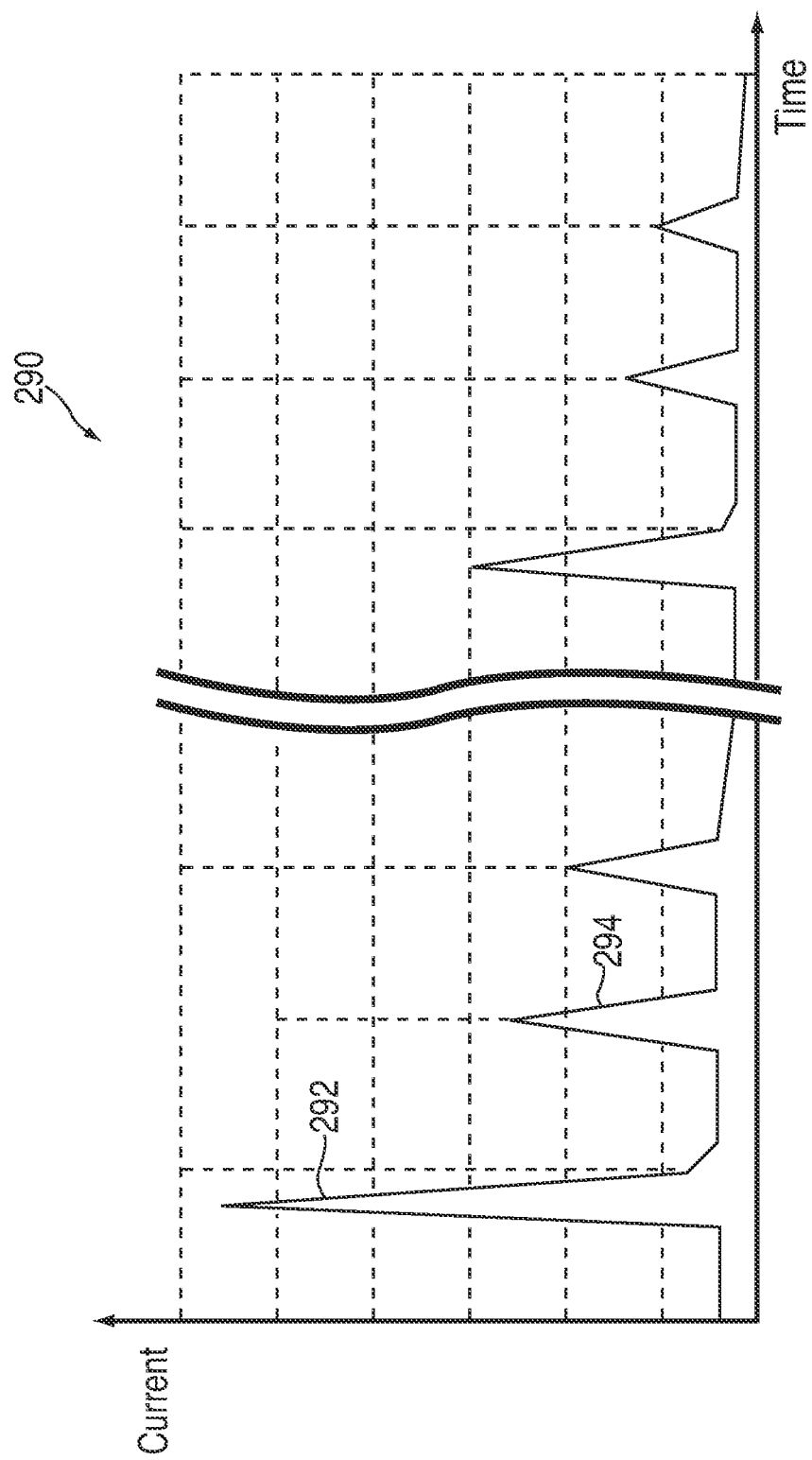
FIG. 2C is a graph illustrating a current consumption profile of a NMV package in accordance with various embodiments of the invention.

FIG. 2C shows illustrative current consumption profile 290. Current consumption profile 290 gives an example of the current consumption of a NVM die (e.g., one of NVM dies 224 or 274) during a verification-type sensing operation. With several peaks, including peaks 292 and 294, current consumption profile 290 illustrates how peaky a verification-type sensing operation may be. These verification-type sensing operations may be of particular concern, as these operations may be likely to occur across multiple NVM dies at the same time (i.e., due to employing parallel writes across multiple dies). Thus, if not managed by NVM controller 222 (FIG. 2A) or host processor 260 (FIG. 2B), the peaks of different NVM dies may overlap and the total current sum may be unacceptably high.

This situation may occur with other types of power-intensive operations, such as erase and program operations. Thus, when each die is simultaneously accessed (e.g., by way of a program, read, erase, or a combination thereof), the cumulative current consumption profile can be significantly higher than that of a single die.

Figure 3:
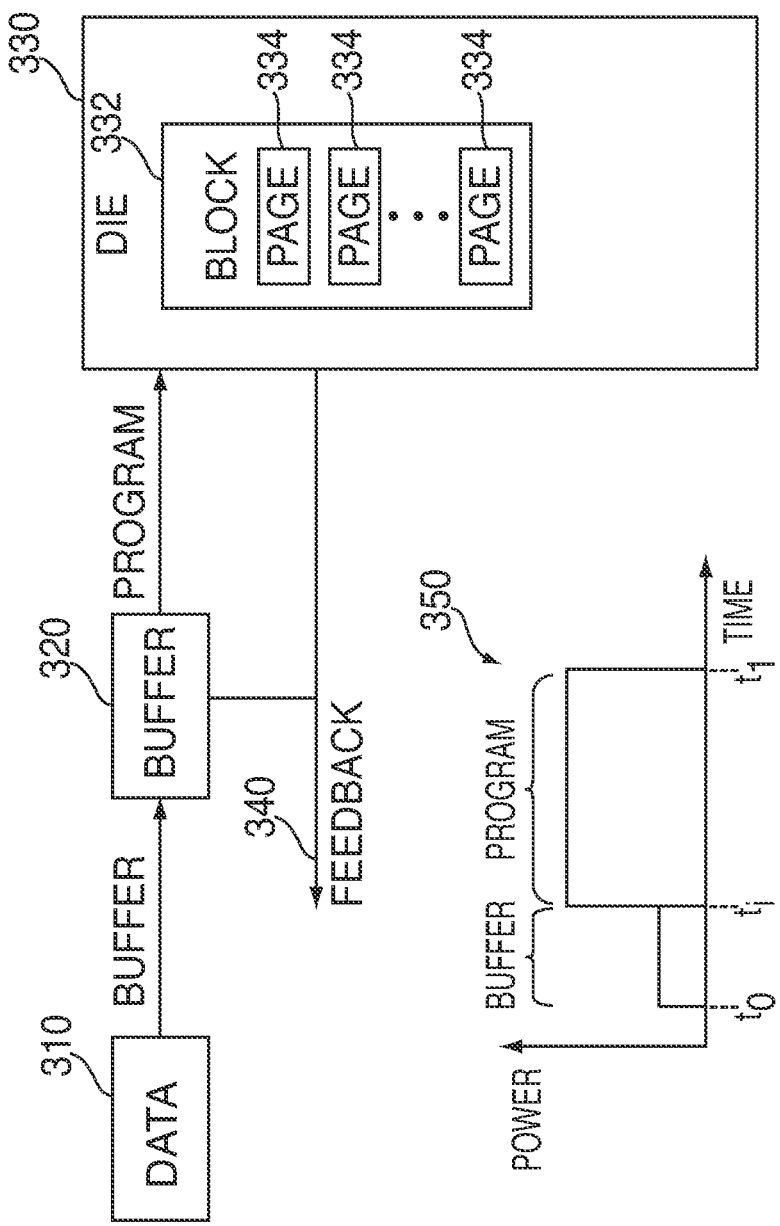
FIG. 3 is an illustrative block diagram showing in more detail a portion of a NVM package in accordance with various embodiments of the invention.

FIG. 3 is an illustrative block diagram showing in more detail a portion of a NVM package in accordance with an embodiment of the invention. FIG. 3 shows how data can be transferred from data source 310 to buffer 320, and then from buffer 320 to one of pages 334, which resides in one of blocks 332 of die 330, during a write operation. A write operation can include two parts: (1) a buffer operation, which is a transfer of data from data source 310 to buffer 320, and (2) a program operation, which is a transfer of data from buffer 320 to die 330. Both parts may have a time component and a power consumption component. The buffering operation and the time required to fully perform it is referred to herein as Tbuff. The programming operation and the time required to fully perform it is referred to herein as Tprog.

The buffer and program parts of a write operation are illustrated in timing diagram 350. Diagram 350 shows a write operation starting at time, t0, and ending at time, t1. The buffer part may occupy a relatively small portion of the overall write operation, starting at t0 and ending at ti, whereas the program part may occupy a relatively large portion of the write operation, starting at ti and ending at t1. Diagram 350 also shows illustrative power consumption for the buffer and program parts. The program part consumes substantially more power than the buffer part.

Data source 310 can be a black box representation of any source of data. For example, the data source can be data bus lines that route data to and from the NVM package. Data source 310 may receive data from a host processor such as host processor 210 or 260 of FIGS. 2A and 2B.

Buffer 320 can be any suitable structure for temporarily storing data. For example, buffer 320 may be a register. Buffer 320 may be used because it can receive and store data at a much faster rate than die 330. Thus, buffer 320 enables a NVM interface to dispatch data to respective dies for temporary and fast storage (in buffer 320), thereby freeing up the data lines for further data transfer. If buffer 320 were not present, the data lines would be busy until all the data was written to die 330.

Die 330 can include a predetermined number of physical blocks 332 and each block can include a predetermined number of pages 334. Pages and blocks represent physical locations of memory cells within die 330. Cells within the pages or blocks can be accessed using addressing circuitry (not shown) associated with the NVM package in which the cells reside. Typically, only one block per die can be accessed at any given time. In some embodiments, a die may be divided into multiple planes, where blocks in each plane of the die can be simultaneously accessed.

In some embodiments, blocks from two or more dies can be virtually linked together to form a superblock. Blocks need not be in the same row of each die to be virtually linked as a superblock. In fact blocks may be chosen randomly from two or more dies to form a superblock. In some embodiments, blocks may be chosen from two or more planes, in which blocks in each plane are simultaneously accessible. Superblocks provide operational parallelism, thereby enabling programming, reading, and erase operations to be performed on blocks located in different planes in parallel. In another embodiment, pages from two or more dies or planes may be virtually linked together to form superpages. A translation layer being implemented in an NVM interface may keep track of superblocks or superpages.

Feedback line 340 can provide information relating to operation of die 330 and/or buffer 320. For example, feedback line 340 can provide feedback information such as when the buffer part and program part of the write operation are complete, the number of pulses required to program a page, a voltage signal, a voltage range, or any other information relating to operation of die 300. It is understood that the time and power of any part of a write operation can be resolved down to the die, region of the die, block, or page (e.g., lower page or upper page), and that any of this information may be provided on feedback line 340. The information in feedback line 340 may be provided to an NVM controller (e.g., NVM controller 222) and/or a host processor, or more particularly to a power capping module.

It is understood that although the NVM operation discussed in FIG. 3 relates to programming operations, other NVM operations such as read and erase can exhibit similar timing and power consumption parameters. For example, a read operation may have a read part and a buffer part. The read part may consume more power than the buffer part and it may also take longer to perform.

FIG. 4A shows illustrative cumulative current consumption profile 410 of all die in a NVM package being controlled by a prior art system. Profile 410 may be produced in a system that does not employ a power limiting scheme. As a result, current profile 410 may include instances of peak current consumption, as indicated by peaks 412 and 414. Since such a prior art system permits peak power events to occur, it has to be designed to accommodate such events. This places an unnecessary design restraint on the system, thereby forcing it to handle NVM events that reach peak current and to have sufficient power on reserve to meet the peak current requirement. Moreover, because peak current events are relatively infrequent, the average current consumption is below peak current, as shown. This disparity in peak current and the average current results in excessive current overhead being allocated to the NVM package. Embodiments according to the invention overcome the deficiency of FIG. 4A.

FIG. 4B shows illustrative cumulative current consumption profile 420 of all die in a NVM package being controlled by a system according to an embodiment of the invention (e.g., system 100, system 200, or system 250). Profile 420 is produced in a system that uses a power limiting or current liming scheme. This scheme may cap current consumption, thereby preventing the instantaneous current from exceeding a current threshold. By capping current, peaks 422 and 424 are not permitted to instantaneously consume as much current they would have otherwise consumed if not limited by the current threshold. As shown, peaks 422 and 424 may be flattened because the number of concurrent NVM operations is being limited by a power limiting scheme according to an embodiment of the invention. Thus, NVM events having concurrent operational load, which would otherwise exceed the current threshold if permitted to operate without limit, are prevented from operating as such and are distributed over time to ensure that the current consumption does not exceed the threshold. Techniques for limiting concurrent operation of NVM events are discussed below in more detail in connection with the description accompanying FIGS. 6-12.

Use of a power limiting scheme can reduce the power overhead burden on the NVM package. This can enable the system to allocate power resources to other components within the system because the current threshold set by the power limiting scheme can set the maximum power draw by the NVM package. In some embodiments, the power limiting scheme may vary the current threshold depending on various system parameters. For example, if other components in the system such as a processor are relatively idle, the current threshold for the NVM package can be increased to permit additional concurrent NVM operations. When the other components become relatively active, the current threshold for the NVM can be decreased.

Figure 5:
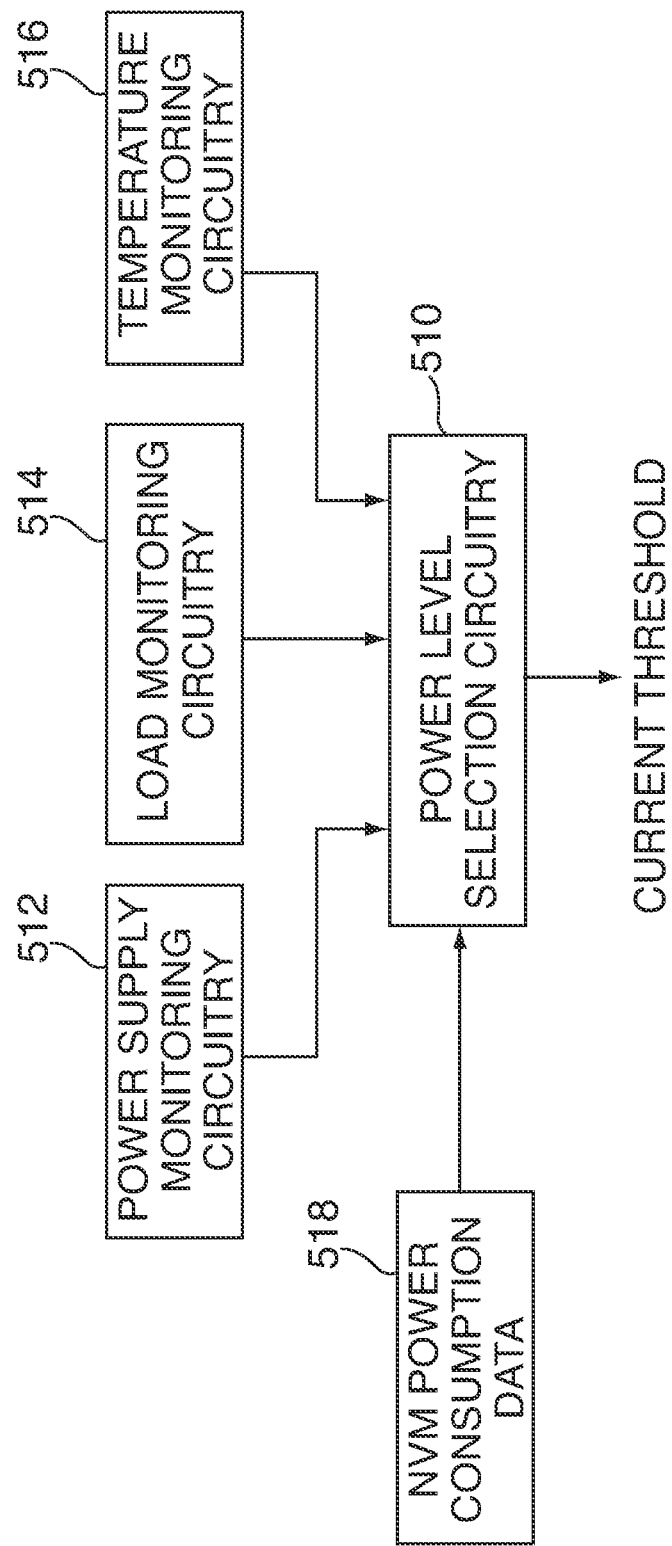
FIG. 5 shows an illustrative block diagram of power level selection circuitry in accordance with various embodiments of the invention.

FIG. 5 shows an illustrative block diagram of power level selection circuitry 510 operative to provide and dynamically vary a current threshold based on inputs received from power supply monitoring circuitry 512, load monitoring circuitry 514, temperature monitoring circuitry 516, and NVM power consumption data 518. Selection circuitry 510 may provide the current threshold to a NVM interface (e.g., NVM interface 118) or an NVM package (e.g., NVM 120).

Power supply monitoring circuitry 512 can monitor an available power level with the system and provide its data to power level selection circuitry 510. For example, circuitry 512 may monitor the energy level of a battery. As another example, circuitry 512 may detect whether the system is receiving power from an external source such as a laptop or power brick. Moreover, when the system is receiving external power, circuitry may indicate to power level selection circuitry how much power is being received (e.g., 500 mAmps from a laptop or 1 Amp from a power brick). Load monitoring circuitry 514 can monitor a real-time load of various components (e.g., processor, memory, backlight, LCD, user interface, etc.) within the system. Circuitry 514 can also predict the load of the components based on, for example, command queues existing within the system. Temperature monitoring circuitry 516 can monitor the temperature of the system.

NVM power consumption data 518 may specify how much power can be consumed by the NVM package. The power consumption resolution of the NVM package may vary from relatively specific (e.g., power or current consumption of an upper page) to relatively general (e.g., power consumption of a particular die). Using this data, selection circuitry 510 can determine how many concurrent NVM operations can be performed for a given current threshold. Data 518 may be derived, for example, from NVM package vendors or from testing that determines power consumption of the NVM package. An example of test for determining power consumption of NVM packages can be found U.S. patent application Ser. No. 12/843,438, filed Jul. 26, 2010, entitled "Peak Power Validation Methods and Systems for Non-Volatile Memory," the disclosure of which is incorporated by reference herein in its entirety.

Selection circuitry 510 can balance the data it receives and set the current threshold accordingly. For example, if supplied power is above a predetermined power threshold, the system load is below a predetermined load threshold, and the temperature is below a predetermined temperature threshold, circuitry 510 may select a relatively high current threshold. As another example, if the supplied power is below a predetermined power threshold, the system load is above a predetermined load threshold, and the temperature is below a predetermined temperature threshold, circuitry 510 may select a relatively low current threshold. It is understood that theses examples are merely illustrative and that circuitry 510 may receive additional inputs beyond those discussed herein as factors for dynamically varying the current threshold.

Referring now to FIGS. 6-12, several techniques for limiting power consumption in NVM operations are discussed. Each technique makes reference to the time to buffer and time to program, as previously discussed above in FIG. 3. The time to buffer will be referred to herein as Tbuff and the time to program will be referred to herein as Tprog. Some of the FIGS. will include reference to dies, which are numbered. Tbuff and Tprog may be appended with a die number (e.g., Tprog1) to indicate which die the Tbuff and Tprog operation is associated. For example, Tprog1 refers to the time to program for die number 1.

Figure 6:
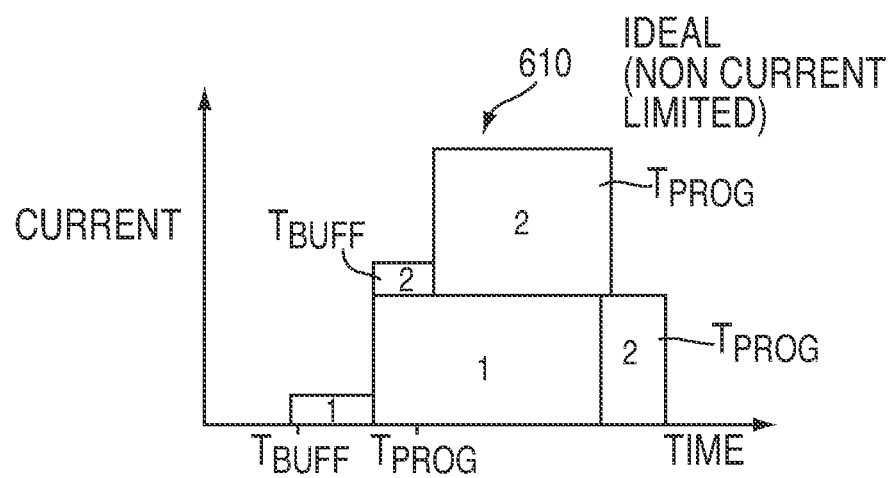
FIGS. 6-12 show several timing diagrams and flowcharts associated with power limiting schemes in accordance with various embodiments of the invention.

FIG. 6 shows illustrative ideal, non-current limited, timing diagram 610. Timing diagram 610 shows Tbuff and Tprog for two dies, labeled with numbers 1 and 2. It is understood that additional dies can be shown, but have been omitted to avoid overcomplicating the drawing. As shown, the NVM event begins with Tbuff1, and immediately following its completion, Tprog1 and Tbuff2 commence. After Tbuff2 is complete, Tprog2 commences. At this point, the current consumption is at its highest because both Tprog1 and Tprog2 are in concurrent operation. When Tprog1 is complete, the current consumption drops because only Tprog2 is being performed. Timing diagram 610 is ideal because no current threshold is imposed on the NVM operations, thus allowing the current consumption of both die 1 and 2 to stack up.

Figure 7:
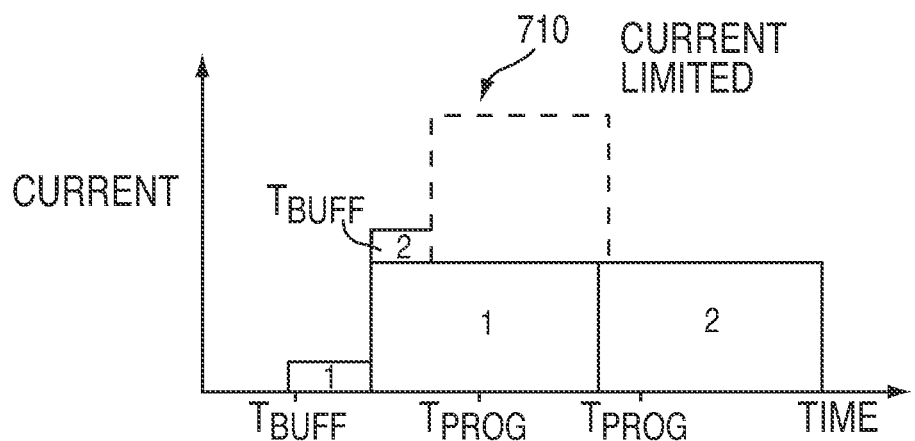

FIG. 7 shows illustrative current limited timing diagram 710 in accordance with an embodiment of the invention. Timing diagram 710 may adhere to a current threshold that effectively limits concurrent die operation to just one die. As shown, the NVM event begins with Tbuff1, and immediately following its completion, Tprog1 and Tbuff2 commence. In contrast to FIG. 6, Tprog2 does not commence until after Tbuff2 and Tprog1 are complete. Thus, delaying the start of Tprog2 until after Tprog1 is complete limits the current consumption, thereby adhering to the current threshold. A dashed line representation of Tprog2 (operating in an ideal mode) is provided for comparison.

Figure 8A:
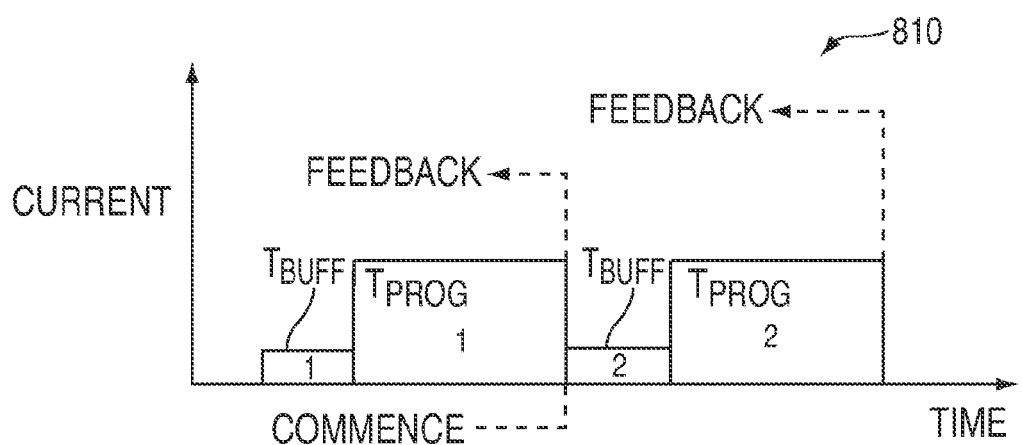

FIG. 8A shows illustrative current limited timing diagram 810 operating according to a reactive power limiting scheme in accordance with an embodiment of the invention. In this scheme, it is assumed that a Tprog operation commences substantially immediately after the Tbuff operation is complete. This scheme uses feedback data to control dispatch (i.e., commencement) of Tbuff and Tprog operations for each die. The feedback data can specify, for example, when Tprog for a given die is complete. Thus, for a given current threshold, it is known how many concurrent Tprog operations can be performed. Using this knowledge, and the feedback data, the reactive power limiting scheme can dispatch as many concurrent operations as possible for the current threshold.

Timing diagram 810 begins with Tbuff1, followed by Tprog1. After Tprog1 is complete, feedback data indicating that Tprog1 is complete is provided. After this feedback data is received, the reactive power limiting scheme can commence Tbuff2, which is immediately followed by Tprog2. Although it is not shown in the FIG. 8A, there may be latency in commencement of Tbuff2 after Tprog1 is complete because of any delay associated with time it takes for the feedback data to be received and processed.

Figure 8B:
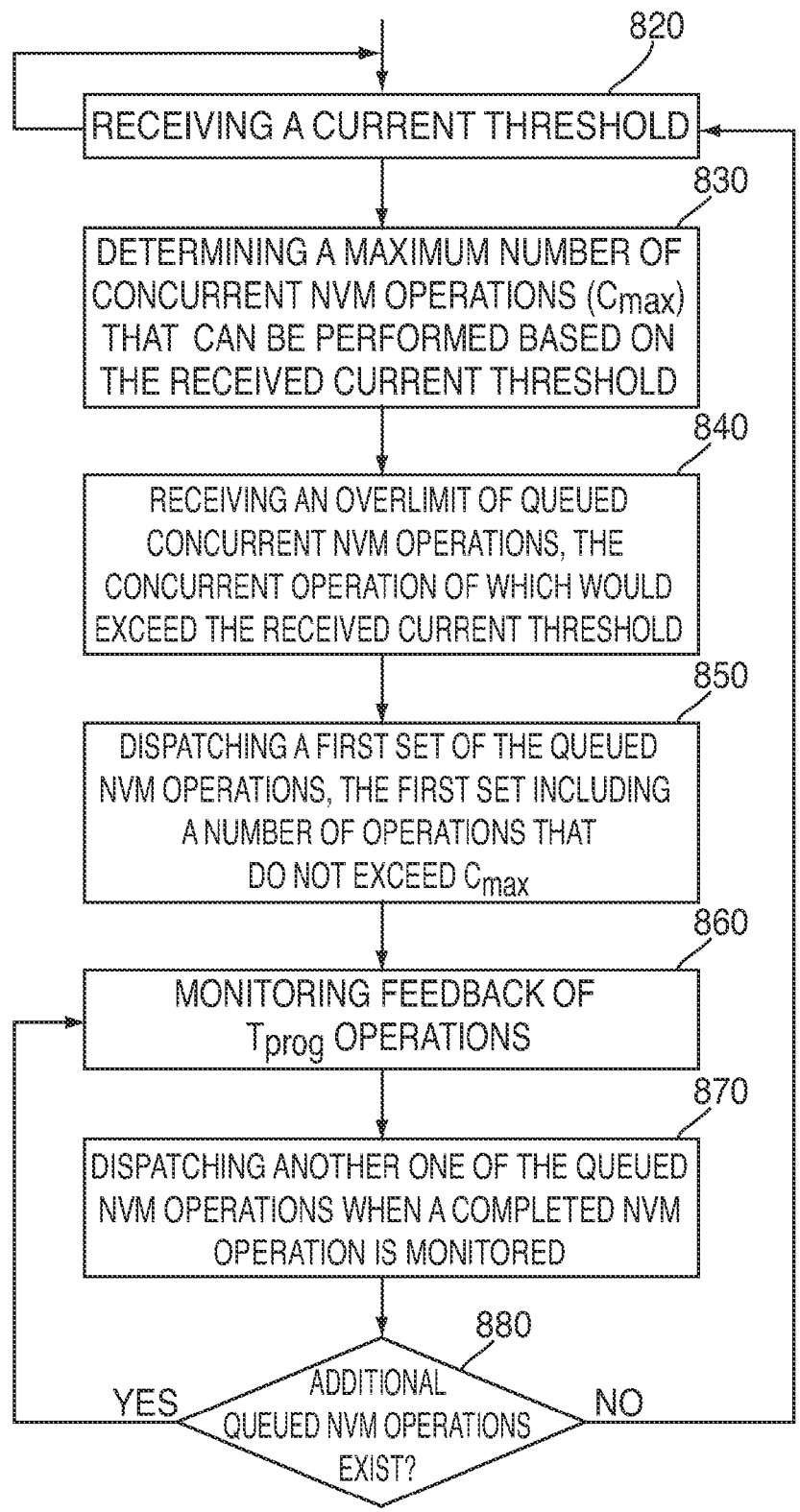

FIG. 8B shows an illustrative flowchart of steps that may be performed by a reactive power limiting scheme in accordance with an embodiment of the invention. Beginning at step 820, a current threshold is received. A feedback loop is provided to show that the current threshold can change depending on various factors in the system. When a different current threshold is received, the power limiting scheme can account for this difference make the appropriate changes as necessary.

At step 830, a determination is made as to a maximum number of concurrent NVM operations, Cmax, that may be performed based on the received current threshold. At step 840, an over limit of queued concurrent NVM operations are received, the concurrent operation of which would exceed the current threshold. At step 850, a first set of the queued NVM operations are dispatched, the first set including a number of operations that do not exceed Cmax. The first set can take into account any prior dispatched NVM operations that have not yet reported Tprog completion. At step 860, feedback of Tprog completions is monitored. Upon detection of a completed Tprog, another one of the queued NVM operations can be dispatched, as indicated in step 870.

At step 880, a determination is made if any additional queued NVM operations exist. If the determination is YES, the process may loop back to step 860. It is understood that additional NVM operations may be received that can add to the over limit of queued NVM operations, thereby further perpetuating the need to limit the number of concurrent operations. If the determination is NO, the process can loop back to step 820.

Figure 9:
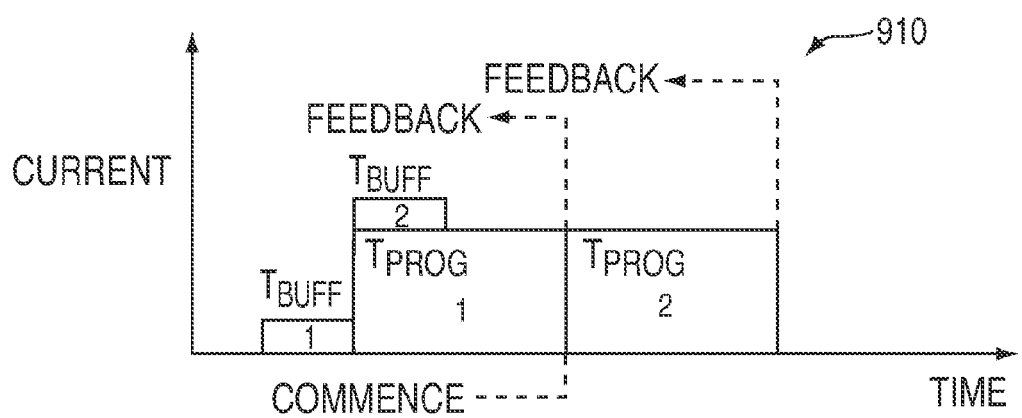

FIG. 9 shows illustrative current limited timing diagram 910 operating according to a pipelined reactive power limiting scheme in accordance with an embodiment of the invention. This scheme is similar to the reactive power limiting scheme discussed above in connection with FIGS. 8A & 8B except that the Tbuff operations can be pipelined. However, the Tprog operations do not automatically commence substantially immediately after the Tbuff operations are complete. This scheme can increase the throughput of NVM operations by eliminating the need to perform a Tbuff operation substantially immediately prior to its corresponding Tprog operation. That is, a Tbuff operation for a second die can be performed before or during the Tprog operation of a first die.

Timing diagram 910 starts with Tbuff1, and after Tbuff1 is complete, both Tprog1 and Tbuff2 can commence. Tbuff2 completes its operation before Tprog1 is complete, but pipeline reactive scheme does not permit Tprog2 to commence until feedback is received indicating Tprog1 is complete. In another embodiment, Tbuff1 and Tbuff2 can commence together, but Tprog2 will not commence until Tprog1 is complete.

Figure 10A:
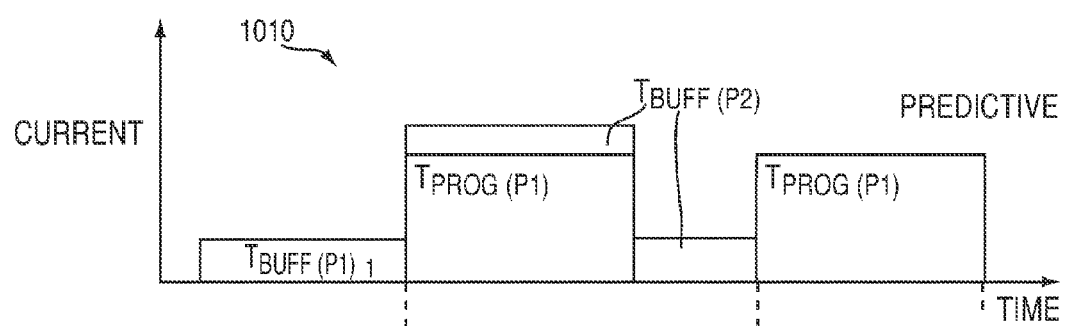
Figure 10B:
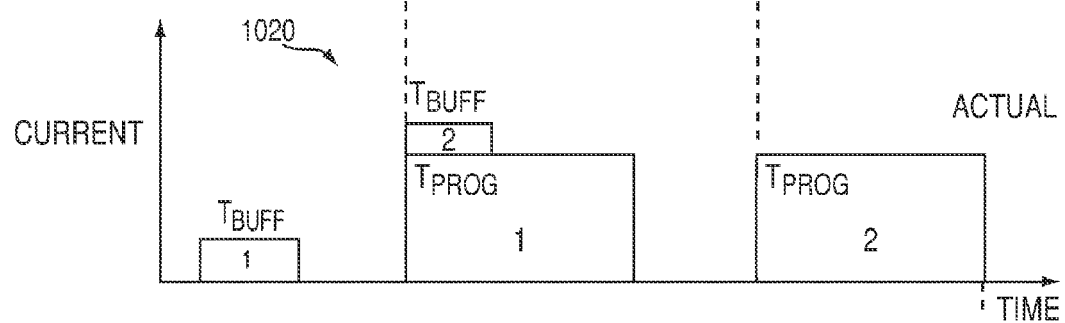
Figure 11A:
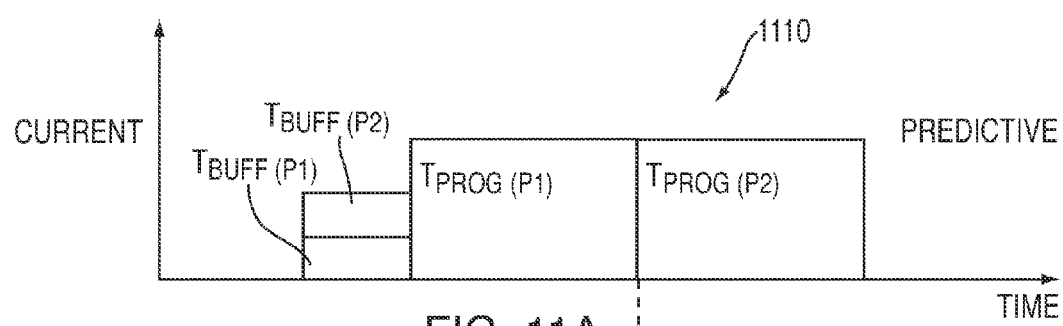
Figure 11B:
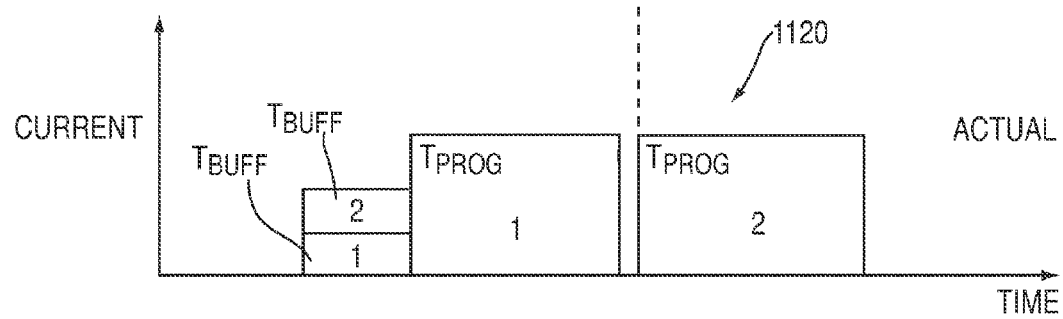

FIGS. 10A & 11A shows illustrative current limited timing diagrams operating according to predictive power limiting schemes in accordance with an embodiment of the invention. Predictive power limiting schemes can predict how long each NVM operation will take to complete, and because it is known how many concurrent Tprog operations can be performed for a given current threshold, the predictive power limiting scheme can operate to dispatch as many concurrent operations as possible. In contrast to the reactive power limiting schemes, predictive power limiting schemes are not required to rely on feedback to determine when subsequent NVM operations can be dispatched. As its name implies, predictive power limiting predicts when a given NVM operation will be complete and dispatches a NVM operation after the time period associated with that prediction ends.

The prediction of a NVM operation can include two parts: (1) time to buffer prediction, Tbuff(p), and (2) time to program prediction, Tprog(p). Tbuff(p) and Tprog(p) are predictions of how long the actual Tbuff and Tprog operations actually take. Selection of Tbuff(p) and Tprog(p) can vary from conservative to aggressive. In other embodiments, context specific predictions can be selected (e.g., Tprog(p) may be higher for programming upper pages than for programming lower pages). In yet another embodiment, a hybrid approach of using prediction with feedback information may be implemented.

Referring now to FIG. 10A, an illustrative current limited timing diagram 1010 operating according to a conservative predictive power limiting scheme in accordance with an embodiment of the invention is shown. In one embodiment, conservative predictions can ensure that adequate time is allotted for each NVM operation such that it is substantially reasonably assured that the actual Tbuff and Tprog times are less than Tbuff(p) and Tprog(p). In another embodiment, conservative predictions can be selected to ensure that Tbuff(p) is greater than Tprog. These approaches can provide a safety net to guard against, for example, unexpected delays in Tprog, but at the cost of predicting more time than actually needed for the operation to complete. Thus, there is a potential risk of predictive overhead time that can reduce throughput of concurrent NVM operations.

Timing diagram 1010 shows predictive timing parameters for two dies, and because conservative predictive parameters are selected, an assumption is made that Tbuff takes a longer time to complete than Tprog. In practice, the opposite is true; Tprog generally always takes longer to complete than Tbuff. As shown, Tbuff(p1) and Tbuff(p2) are allotted greater time for completion than Tprog(p1) and Tprog(p2). Referring now to both FIG. 10A and FIG. 10B, timing diagram 1020 shows actual timing parameters for the two die operating according to the conservative predictive power limiting scheme. The start of Tprog2 is keyed off of the completion of Tbuff(p2), and not the completion of Tprog1. Thus, by ensuring that Tbuff(p2) is greater than Tprog1, there is no overlap of Tprog1 and Tprog2, thereby preventing an undesired concurrent operation of NVM operations.

Figure 10C:
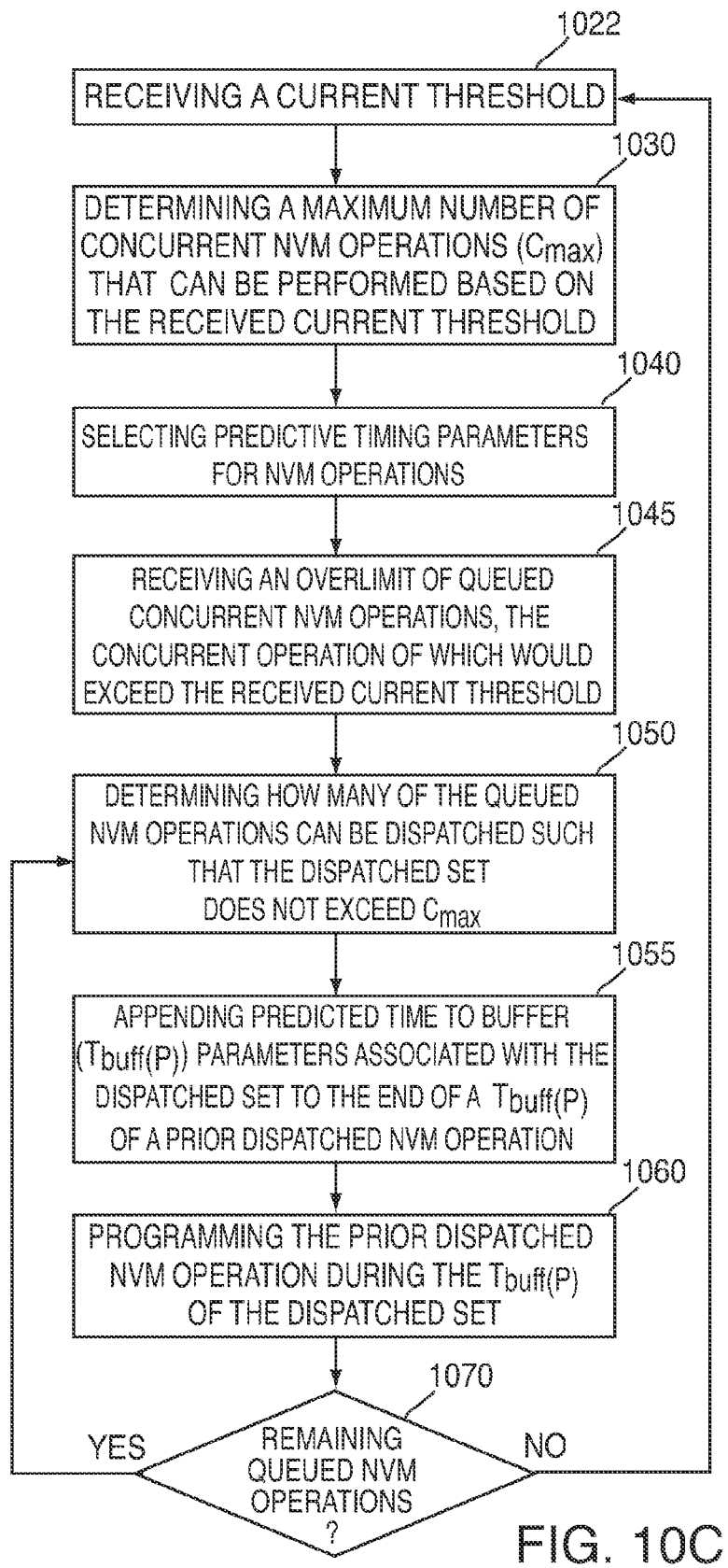

FIG. 10C shows an illustrative flowchart of steps that may be taken to implement a conservative predictive power limiting scheme in accordance with an embodiment of the invention. Beginning at step 1022, a current threshold is received. A feedback loop is provided to show that the current threshold can change depending on various factors in the system. When a different current threshold is received, any limitation associated with the different current threshold is applied by predictive power limiting scheme. At step 1030, a determination is made as to a maximum number of concurrent NVM operations, Cmax, that may be performed based on the received current threshold.

At step 1040, the predictive scheme selects predictive timing parameters for NVM operations. These parameters can include Tbuff(p) and Tprog(p) and can be uniformly applied to all NVM operations. For example, in one embodiment, the time duration of Tbuff(p) may be greater than the time duration Tprog(p). The actual values selected for predictive timing parameters may be derived from any suitable source. For example, the parameters may be based on NVM package vendor specifications, an average time duration of Tprog and/or Tbuff, or testing data. In some embodiments, the actual values selected for Tbuff(p) and Tprog(p) may be based on maximum durations required for each of these NVM operations. In contrast to an approach that selects actual values based on the average durations for these NVM operations, using maximum durations for Tbuff(p) and Tprog(p) can prevent a situation where a prior dispatched operation has not yet completed before a next operation begins.

At step 1045, an over limit of queued concurrent NVM operations are received, the concurrent operation of which would exceed the current threshold if permitted to operate all at once. For ease of discussion, assume the queued NVM operations are received while at least one Tprog operation is in progress. At step 1050, a determination is made as to how many of the queued NVM operations can be dispatched such that the dispatched set does not exceed Cmax. The determination can take into account any prior dispatched NVM operations that have already been dispatched but are still within a predicted timing parameter such as Tbuff(p). For example, assume that 5 concurrent NVM operations can be performed for the selected current threshold, and that one prior dispatched NVM operation is outstanding, but not presumed to be complete because the predicted time parameter (e.g., the Tbuff(p)) for the prior dispatched operation has not expired. Operating under this assumption, the dispatched set can include 4 queued NVM operations. It is understood that while step 1050 or any subsequent step is being performed, additional NVM operations may be added to the queue.

At step 1055, Tbuff(p) parameters associated with the dispatched set of queued NVM operations are appended to the end of the Tbuff(p) parameter of a prior dispatched NVM operation. If there is more than one prior dispatched NVM operation, the last in sequence prior dispatched NVM operation may be the keyed off of NVM operation. In other words, the dispatched set Tbuff(p) parameters can commence when Tprog of the prior dispatched NVM operation begins. Thus, appending the first set Tbuff(p) parameters in this manner ensures that Tprog of the prior dispatched NVM operation is provided with sufficient time to complete its operation before the Tprog of the dispatched set begins.

At step 1060, the prior dispatched NVM operation is programmed into a page of the NVM package during the Tbuff(p) of the dispatched set. At step 1070, a determination is made if there are any remaining queued NVM operations. If YES, the process reverts back to step 1050. If NO, the process reverts back to step 1022.

FIG. 11A shows illustrative current limited timing diagram 1110 operating according to an aggressive predictive power limiting scheme in accordance with an embodiment of the invention. In one embodiment, the aggressive scheme can assume that Tbuff is substantially constant for each NVM operation and that Tprog may vary depending on one or more factors. As such, the aggressive scheme can affix a constant to Tbuff(p) such as a time value typically associated with buffer operations, and the scheme may use a sliding scale of predictive times for Tprog(p). In addition, the Tbuff operations may be pipelined and ready for the Tprog operation as soon as the scheme permits. Commencement of Tprog for a concurrent NVM operation (that would result in a cumulative power consumption that exceeds the current threshold if not limited by this scheme) can be at the end of a Tprog(p) of a prior dispatched NVM operation. This is in contrast to the conservative predictive approach, which commenced Tprog at the end of Tbuff(p).

The aggressive aspect of this scheme is provided by the sliding scale of Tprog(p). It is desirable to minimize Tprog (p), but not to an extent that the actual Tprog operation exceeds Tprog(p). Tprog(p) can vary based on any number of factors. For example, Tprog(p) can vary based on the current threshold, whether data is being programmed to a lower page or an upper page, the region of die the data is to be programmed, the number of NVM operations in the over limit queue, or a combination thereof.

For instance, the current consumed by a system may vary depending on whether data is being programmed to a lower or upper page. Because upper page programming generally takes longer than lower page programming, the current consumption for upper page programming is correspondingly higher. Thus, a longer predictive time may be assigned to Tprog(p) for upper page programming than for lower page programming.

Timing diagram 1110 shows predictive Tbuff(p) and Tprog (p) for two die operating under a current threshold that only permits one concurrent NVM operation. As shown, Tbuff(p1) and Tbuff(b2) to illustrate that buffer operations can be pipelined. Tprog(p1) commences immediately after Tbuff(p1), and because only one concurrent NVM operation is permitted in this example, Tprog(p2) keys off of the predictive end of Tprog(p1). Referring now to both FIG. 11A and FIG. 11B, timing diagram 1120 shows actual timing parameters for the two die operating according to the aggressive predictive power limiting scheme. The start of Tprog1 is keyed off of the completion of Tbuff(p1), and the start of Tprog2 is keyed off the completion of Tprog(p1).

Figure 11C:
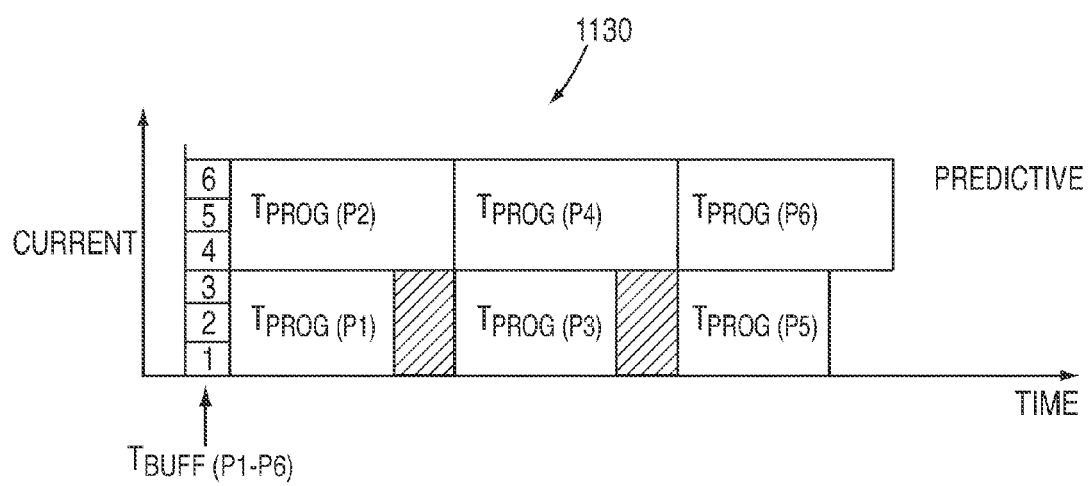
Figure 11D:
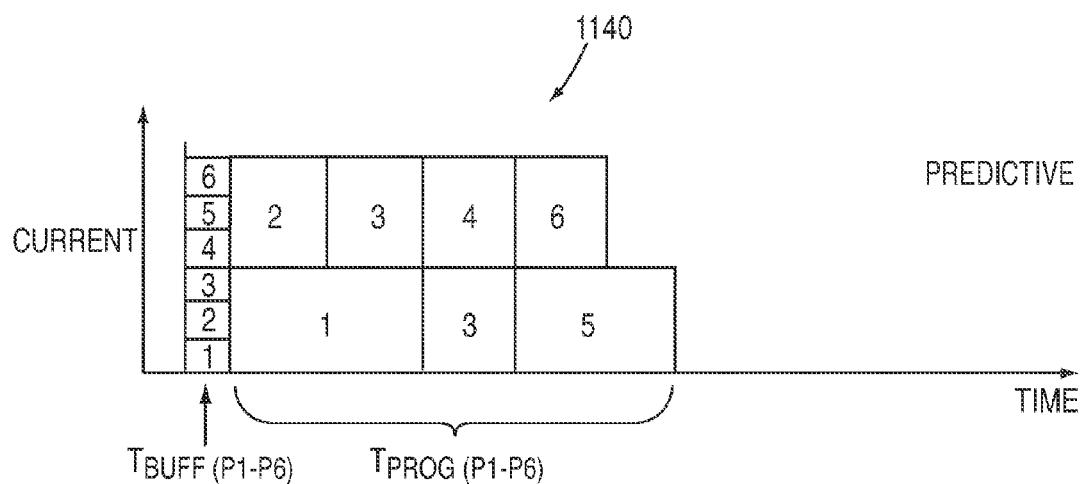

FIGS. 11C and 11D show additional illustrative timing diagrams 1130 and 1140, respectively, according to respective aggressive predictive power limiting schemes in accordance with embodiments of the invention. Timing diagrams 1130 and 1140 show six concurrent NVM operations operating under a current threshold that permits only two concurrent NVM operations. In addition, timing diagrams 1130 and 1140 show how the predictive Tprog(p) from one NVM operation to another may vary (based on any suitable factors such as those discussed above). For example, in timing diagram 1130, NVM Tprog(p) operations 1, 3, and 5 are allotted less time than NVM Tprog(p) operations 2, 4, and 6. Whereas, as in timing diagram 1140, NVM Tprog(p) operations 1, 3, and 5 are allotted more time than NVM Tprog(p) operations 2, 4, and 6. In timing diagrams 1130 and 1140, each successive Tprog(p) operation is keyed off the completion of the prior Tprog(p) operation.

Figure 11E:
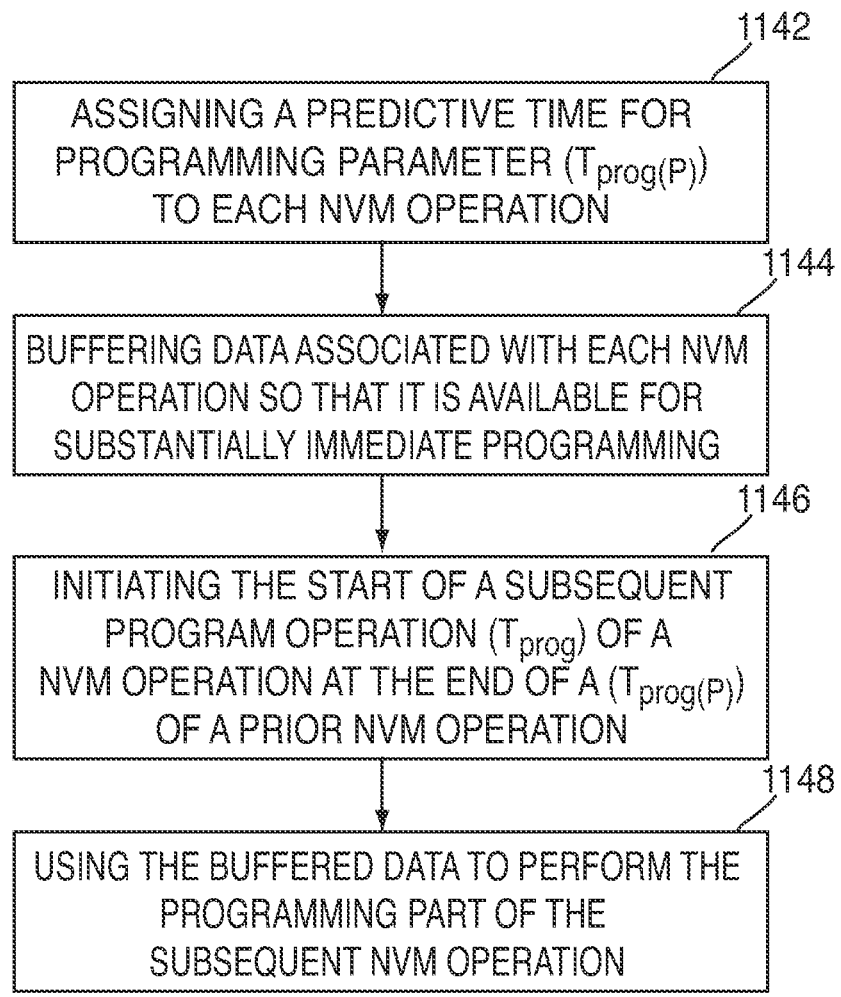

FIG. 11E shows an illustrative flowchart of steps that may be performed by an aggressive predictive power limiting scheme in accordance with an embodiment of the invention. This flowchart is similar in many respects to the flowchart discussed above in connection with FIG. 10C, with the principle difference being that Tprog operations are keyed off of the end of Tprog(p) prediction.

Beginning at step 1142, each NVM operation is assigned a predictive time for programming parameter (Tprog(p)). This parameter may vary depending on various factors as discussed above. At step 1144, data associated with each NVM operation is buffered so that data is available for substantially immediate programming. That is, data for multiple NVM operations can be stored in multiple respective buffers, but the data stored therein is not automatically programmed into a page of a die.

At step 1146, the start of a subsequent program operation of a NVM operation is initiated at the end of a Tprog(p) of a prior NVM operation. For example, assume that the subsequent program operation is Tprog2 and that the predictive Tprog(p1) of prior program operation Tprog1 ends at time t1. This assumes that program operation Tprog1 will be complete by the time t1 (which is predicted by Tprog(p1)). Thus, the subsequent program operation Tprog2 starts at time t1. In addition, the predictive Tprog(p2) for program operation Tprog2 also starts at time t1. At step 1148, the buffered data is used to perform the programming part of the subsequent NVM operation.

Figure 12:
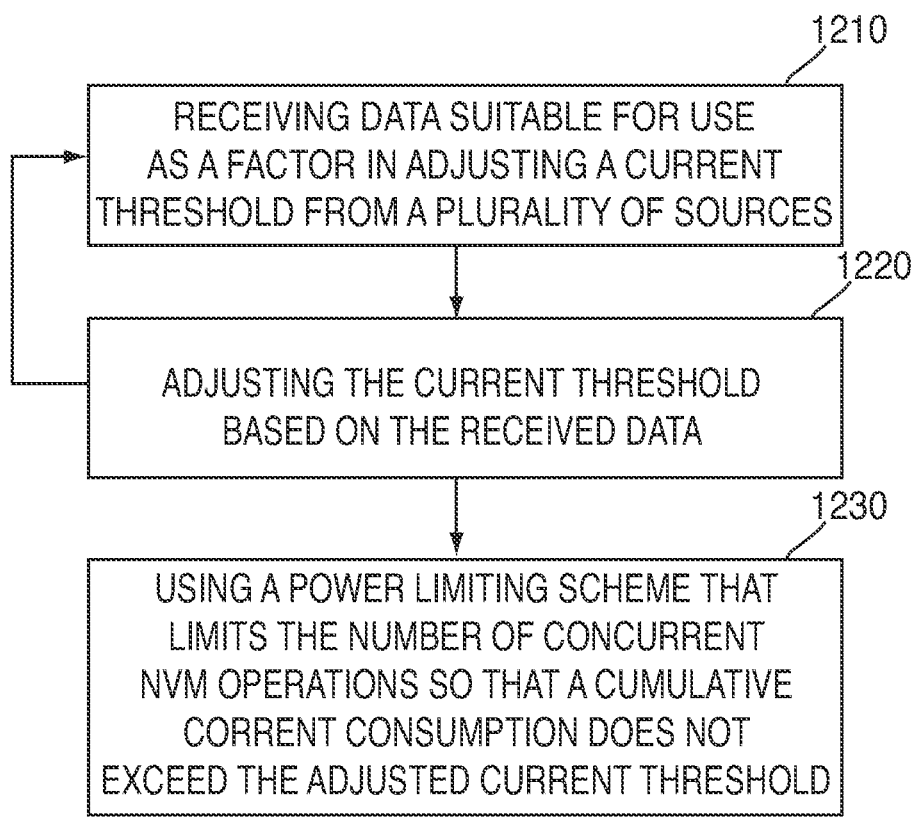

FIG. 12 shows illustrative steps that may be practiced by a system using a power limiting scheme in accordance with an embodiment of the invention. Starting with step 1210, data suitable for use as a factor in adjusting a current threshold is received from a plurality of sources. The sources can include various monitoring circuitry that monitors components and conditions associated with those components (e.g., circuitry 512, 514, and 516 of FIG. 5). The source can also include data that specifies operating parameters (e.g., NVM package peak power consumption) of various components of the system. The current threshold may set a maximum current consumption for a NVM package even though the NVM package is capable of consuming more power than that set by the threshold. The current threshold can be less than a peak current capable of being consumed by the NVM.

At step 1220, the current threshold can be adjusted based on the received data. The system can initially set the current threshold to a minimum current threshold level. This level can ensure that the NVM package is able to meet a minimum threshold of performance. If the received data indicates that additional power can be provided to the NVM package, the current threshold can be adjusted upwards to take advantage of the additional power. When the received data indicates the additional power is no longer available, current threshold can be downward adjusted accordingly. A feedback loop from step 1220 to step 1210 is provided to show that the current threshold can be adjusted in real-time.

At step 1230, a power limiting scheme is used to limit the number of concurrent NVM operations so that a cumulative current consumption does not exceed the adjusted current threshold. The power limiting scheme can be any one of the power limiting schemes discussed herein (e.g., one of the reactive or predictive power limiting schemes). In some embodiments, the system may switch between two or more power limiting schemes.

It should be understood that the steps included in flowcharts of FIGS. 8B, 10C, 11E, and 12 are merely illustrative. Any of the steps may be removed, modified, or combined, and any additional steps may be added, without departing from the scope of the invention.

The described embodiments of the invention are presented for the purpose of illustration and not of limitation.

What is claimed is:
1. A method for predictively limiting power consumption of a non-volatile memory (NVM), the NVM operative to perform NVM operations, each of which includes a buffering part and a programming part, the buffering requiring time,

Tbuff, to be fully performed, and the programming part requiring time, Tprog, to be fully performed, the method comprising:
- receiving a current threshold;
- determining a maximum number of concurrent NVM operations that can be performed based on the current threshold;
- assigning predictive timing parameters for each NVM operation, the predictive timing parameter including a predictive time parameter, Tbuff(p), for the buffering part of a NVM operation to be fully performed, wherein Tbuff(p) is greater than Tprog;
- receiving an overlimit of queued concurrent NVM operations, the concurrent operation of which would have a cumulative current consumption that exceeds the current threshold;
- determining how many of the queued NVM operations can be dispatched as a subsequent set of dispatched NVM operations such that the number of concurrent NVM operations does not exceed the maximum number;
- appending the Tbuff(p) of each NVM operation in the subsequent set to an end of the Tbuff(p) of a prior dispatched NVM operation; and
- performing the programming part of the prior dispatched NVM operation during the Tbuff(p) of the subsequent set.

2. The method of claim 1, further comprising:
performing the programming part of each NVM operation in the subsequent set at an end of a respective Tbuff(p) for each NVM operation in the subsequent set.

3. The method of claim 1, wherein the determining further comprises factoring in prior dispatched NVM operations that can affect the number of concurrent NVM operations.

4. The method of claim 1, wherein the current threshold is less than a peak current capable of being consumed by the NVM.

5. The method of claim 1, wherein the performing the programming part of the prior dispatched NVM operation during the Tbuff(p) of the subsequent set comprises commencing a start of the programming part of the prior dispatched NVM operation at an end of the Tbuff(p) of the prior dispatched NVM operation.

6. A method for predictively limiting power consumption of a non-volatile memory (NVM), the NVM operative to perform NVM operations, each of which includes a buffering part and a programming part, the buffering requiring time, Tbuff, to be fully performed, and the programming part requiring time, Tprog, to be fully performed, the method comprising:
- assigning predictive timing parameters for each NVM operation, the predictive timing parameter including a predictive time parameter, Tprog(p), for the programming part of a NVM operation to be fully performed;
- buffering data associated with each NVM operation so that the data is available substantially immediately for a programming part of the NVM operation;
- initiating the start of the program operation of a subsequent NVM operation at the end of the Tprog(p) of a prior NVM operation, wherein Tprog(p) is greater than Tprog; and
- using the buffered data to perform the programming part of the subsqunet operation.

7. The method of claim 6, further comprising:
receiving a current threshold;
- determining a maximum number of concurrent NVM operations that can be performed based on the current threshold;
- receiving an overlimit of queued concurrent NVM operations, the concurrent operation of which would have a cumulative current consumption that exceeds the current threshold;
- adjusting the Tprog(p) of one or more of the queued NVM operations to ensure that the number of concurrent NVM operations does not exceed the maximum number.

8. The method of claim 6, wherein the Tprog(p) of the prior NVM operation is the Tprog(p) assigned to the NVM operation immediately preceeding the Subsequent NVM operation.

9. The method of claim 6, wherein a time duration of a Tprog(p) assigned to a NVM operation is based on whether data associated with the NVM operation is being programmed in an upper page or a lower page.

10. An electronic device, comprising:
- non-volatile memory (NVM), the NVM operative to perform NVM operations, each of which includes a buffering part and a programming part, the buffering requiring time, Tbuff, to be fully performed, and the programming part requiring time, Tprog, to be fully performed; and
- power capping circuitry in operative communication with the NVM and operative to:
  - receive a current threshold;
  - determine a maximum number of concurrent NVM operations that can be performed based on the current threshold;
  - assign predictive timing parameters for each NVM operation, the predictive timing parameter including a predictive time parameter, Tbuff(p), for the buffering part of a NVM operation to be fully performed, wherein Tbuff(p) is greater than Tprog;
  - receive an overlimit of queued concurrent NVM operations, the concurrent operation of which would have a cumulative current consumption that exceeds the current threshold;
  - determine how many of the queued NVM operations can be dispatched as a subsequent set of dispatched NVM operations such that the number of concurrent NVM operations does not exceed the maximum number;
  - append the Tbuff(p) of each NVM operation in the subsequent set to an end of the Tbuff(p) of a prior dispatched NVM operation; and
  - instruct the NVM to perform the programming part of the prior dispatched NVM operation during the Tbuff(p) of the subsequent set.

11. The device of claim 10, wherein the power capping circuitry is operative to:
instruct the NVM to perform the programming part of each NVM operation in the subsequent set at an end of a respective Tbuff(p) for each NVM operation in the subsequent set.

12. The device of claim 10, wherein the power capping circuitry is operative to factor in prior dispatched NVM operations that can affect the number of concurrent NVM operations.

13. The device of claim 10, wherein the current threshold is less than a peak current capable of being consumed by the NVM.

* * * * *

UNITED STATES PATENT AND TRADEMARK OFFICE
CERTIFICATE OF CORRECTION

PATENT NO. : 8,495,402 B2  
APPLICATION NO. : 12/969839  
DATED : July 23, 2013  
INVENTOR(S) : Matthew Byom et al.

Page 1 of 1

It is certified that error appears in the above-identified patent and that said Letters Patent is hereby corrected as shown below:

In the Specification

In Column 2, Line 23, delete "NMV" and insert -- NVM --, therefor.

In Column 9, Line 24, delete "that theses" and insert -- that these --, therefor.

In the Claims

In Column 15, Line 62, in Claim 6, delete "subsquent" and insert -- subsequent --, therefor.

In Column 16, Line 7, in Claim 7, delete "threshold;" and insert -- threshold; and --, therefor.

In Column 16, Line 13, in Claim 8, delete "preceeding the Subsequent" and insert -- preceding the subsequent --, therefor.

Signed and Sealed this  
Thirtieth Day of September, 2014

Michelle K. Lee  
*Deputy Director of the United States Patent and Trademark Office*